US012640217B2

(12) United States Patent (10) Patent No.: US 12,640,217 B2
Prather (45) Date of Patent: May 26, 2026

(54) APPARATUSES SYSTEMS AND METHODS FOR IDENTIFICATION ENCODING FOR MEMORY DEVICES

(71) Applicant: Micron Technology, Inc., Boise, ID (US)

(72) Inventor: Matthew A. Prather, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 18/444,446

(22) Filed: Feb. 16, 2024

(65) Prior Publication Data

US 2024/0290409 A1 Aug. 29, 2024

Related U.S. Application Data

(60) Provisional application No. 63/487,053, filed on Feb. 27, 2023.

(51) Int. Cl.
*G11C 17/16* (2006.01)
*G11C 17/18* (2006.01)
*G11C 29/02* (2006.01)

(52) U.S. Cl.
CPC ............ *G11C 29/027* (2013.01); *G11C 17/16* (2013.01); *G11C 17/18* (2013.01)

(58) Field of Classification Search
CPC ...................................................... G11C 29/02
USPC ...................................................... 365/225.7
See application file for complete search history.

(56) References Cited

U.S. PATENT DOCUMENTS

| 7,062,425 B1* | 6/2006 | Bell ........................ G06F 30/33 |
| | | 257/209 |
| 7,257,715 B2* | 8/2007 | Yamane ................. G06F 21/71 |
| | | 713/189 |
| 2005/0024974 A1* | 2/2005 | Noguchi ................ G11C 16/32 |
| | | 714/E11.034 |
| 2013/0272060 A1* | 10/2013 | Andre ................. G11C 11/1693 |
| | | 365/158 |
| 2014/0078842 A1 | 3/2014 | Oh et al. |
| 2017/0098480 A1 | 4/2017 | Wilson et al. |
| 2021/0263646 A1 | 8/2021 | Chin et al. |
| 2021/0335446 A1* | 10/2021 | Nakamura ............. G11C 29/44 |

FOREIGN PATENT DOCUMENTS

WO         2024182096 A1      9/2024

OTHER PUBLICATIONS

International Search Report & Written Opinion dated Jun. 4, 2024 for PCT Application No. PCT/US2024/014587.

* cited by examiner

*Primary Examiner* — Muna A Techane
(74) *Attorney, Agent, or Firm* — Dorsey & Whitney LLP

(57) ABSTRACT

Memory devices may be assigned enumeration values that uniquely identify the memory devices in a multi-memory device system. In some examples, the enumeration value is assigned by programming one or more fuses in the memory device. In some examples, a post-package repair operation may be used to program the fuses.

19 Claims, 4 Drawing Sheets

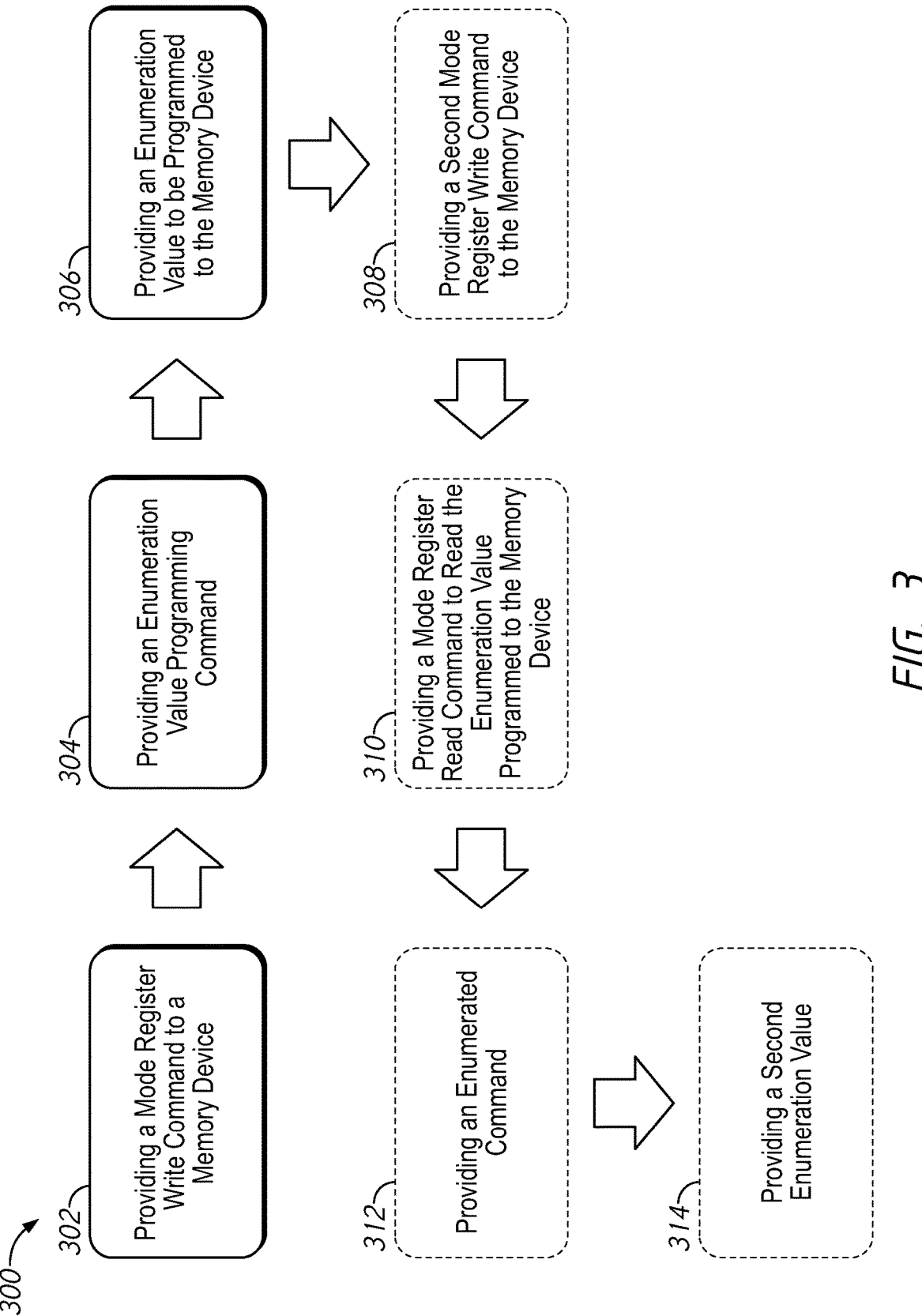

302 Providing a Mode Register Write Command to a Memory Device

304 Providing an Enumeration Value Programming Command

306 Providing an Enumeration Value to be Programmed to the Memory Device

308 Providing a Second Mode Register Write Command to the Memory Device

310 Providing a Mode Register Read Command to Read the Enumeration Value Programmed to the Memory Device 312 Providing an Enumerated Command 314 Providing a Second Enumeration Value

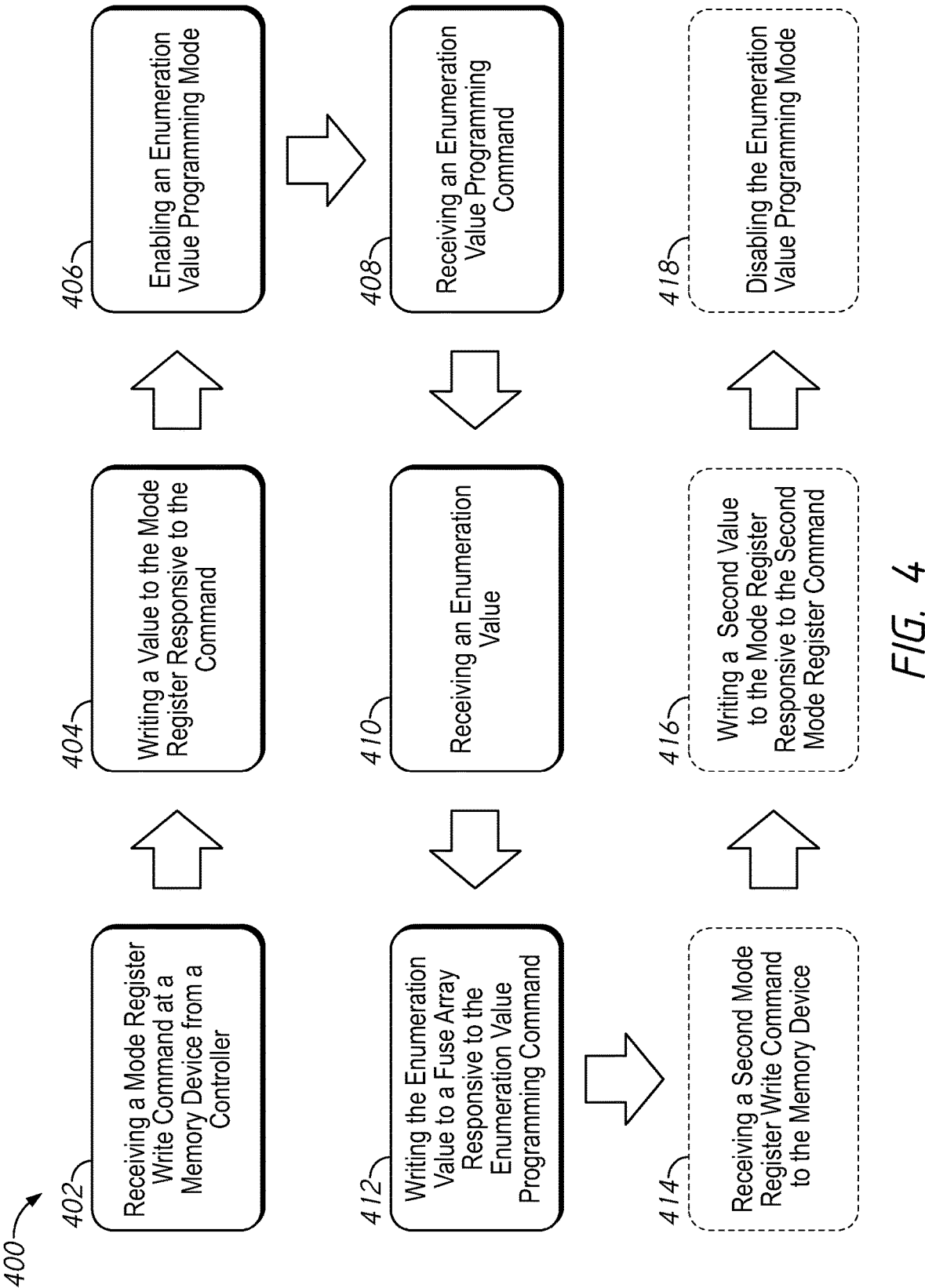

402 Receiving a Mode Register Write Command at a Memory Device from a Controller 404 Writing a Value to the Mode Register Responsive to the Command 406 Enabling an Enumeration Value Programming Mode 408 Receiving an Enumeration Value Programming Command 410 Receiving an Enumeration Value 412 Writing the Enumeration Value to a Fuse Array Responsive to the Enumeration Value Programming Command 414 Receiving a Second Mode Register Write Command to the Memory Device 416 Writing a Second Value to the Mode Register Responsive to the Second Mode Register Command 418 Disabling the Enumeration Value Programming Mode

APPARATUSES SYSTEMS AND METHODS FOR IDENTIFICATION ENCODING FOR MEMORY DEVICES

CROSS-REFERENCE TO RELATED APPLICATIONS

This application which claims the filing benefit of U.S. Provisional Application No. 64/487,053, filed Feb. 27, 2023. This application is incorporated by reference herein in its entirety and for all purposes.

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines).

Some memory systems may include multiple memory devices. For example, a dual in line memory module (DIMM), e.g. "RAM stick," may include several memory devices. The memory devices may be organized by rank, and memory controller controls memory devices of one or more ranks. The memory controller may provide commands and data that may be provided to all of the memory devices of the rank. In some situations, it is desirable for all of the memory devices of the rank to respond to the commands and data provided by the memory controller (e.g., certain read and write commands). However, for other commands, it is desirable for only one of the memory devices to respond. For example, on-die termination (ODT) values may be unique for each memory device. Accordingly, when ODT values are being set (e.g., written to a mode register), they may be set individually for each memory device.

In order to provide commands to specific memory devices, the memory system may provide unique identifiers for one or more of the memory devices.

BRIEF DESCRIPTION OF THE DRAWINGS

FIG. 3 is a flow chart of a method according to embodiments of the present disclosure.

FIG. 4 is a flow chart of a method according to embodiments of the present disclosure.

DETAILED DESCRIPTION

Figure 1:
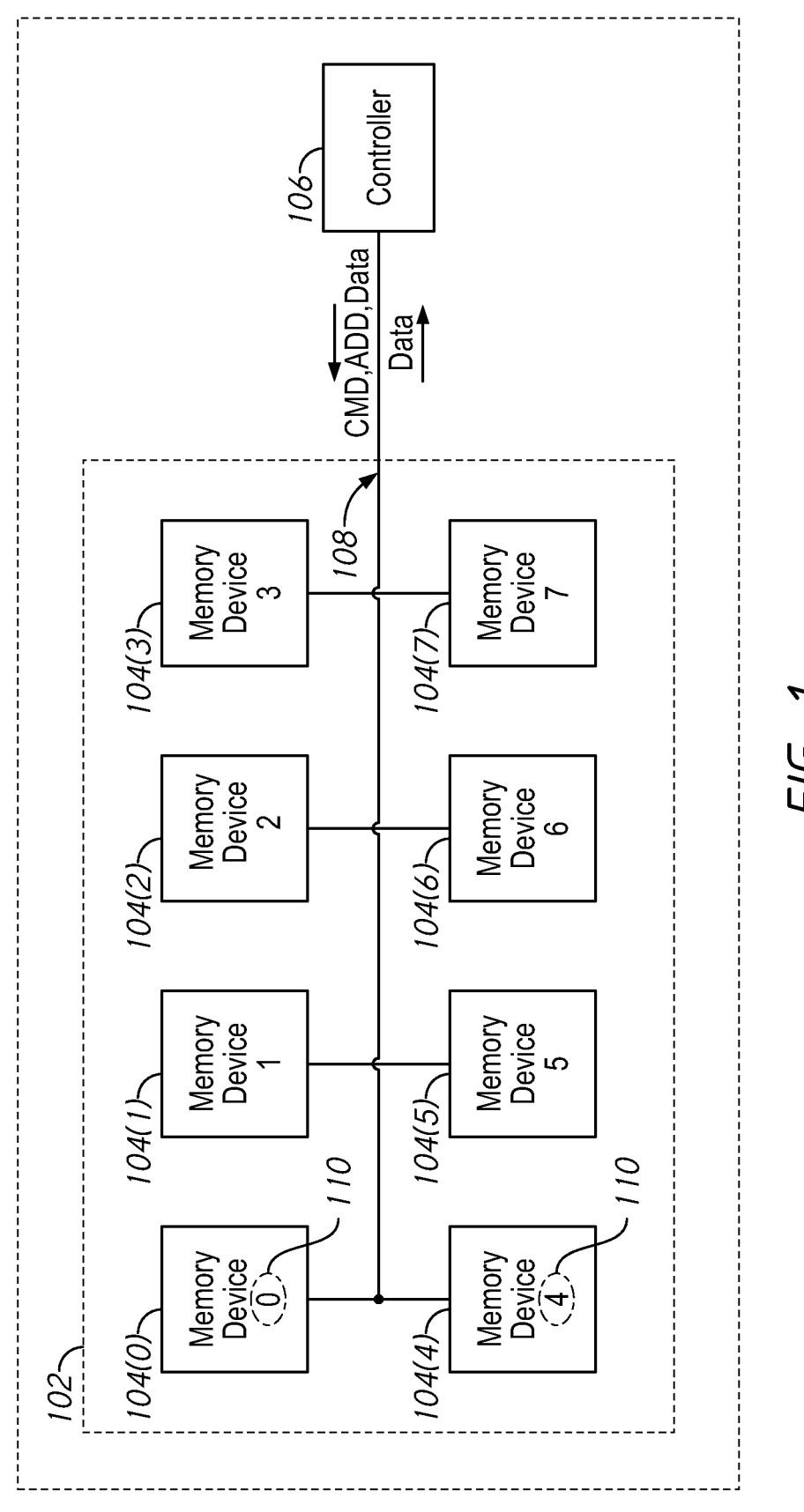
FIG. 1 is a block diagram of at least a portion of a computing system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory device operation and/or their interactions with memory controllers may be defined, at least in part, by one or more standards. For example, the Joint Electron Devices Engineering Council (JEDEC) provides standards for various types of memory such as double-data rate (DDR) DRAM. In JEDEC's standard for DDR4, a per-DRAM addressability (PDA) feature was provided. A memory controller could activate a PDA mode and select particular DRAM devices by setting the DRAM's DQs to a particular state, and DRAMs with DQs in a different state would not be selected, and thus not respond to commands. However, this technique may be time consuming while the memory controller is providing command address states, especially when there are many mode registers (or other registers) that need to be set. It is also time consuming during training.

In DDR5, the JEDEC standard provided an enumeration feature. This utilized the PDA mode introduced in DDR4 to assign a unique enumeration value to each DRAM device. Once all of the DRAM devices have been programmed with a unique enumeration value, the enumeration value can be used for subsequent operations that are specific to a particular DRAM device. However, this technique still depends on an end application having control of the DRAM device's DQs, which may not be possible, particularly when the DRAM has a sideband interface. Further, the enumeration values must be reassigned to each DRAM device after each reset and power-up.

According to embodiments of the present disclosure, memory devices may be assigned a unique enumeration value (e.g., chip ID) by programming fuses of a fuse array. In some embodiments, the enumeration value may be programmed when the memory device is packaged in a memory system (e.g., a DIMM). In some embodiments, the fuses may be programmed by a post-package repair (PPR) operation initiated by a modified PPR command. In some embodiments, the fuses may be included in the fuse array used to remap addresses to redundant word lines. In some embodiments, the existing PPR circuitry may be used to program the fuses of the fuse array used to indicate the enumeration value of the memory device.

In some applications, programming an enumeration value of the memory device using fuses may obviate the need to program the enumeration values for the memory devices for each reset and power-up. In some applications, using fuses to program the enumeration value may allow memory device-specific commands to be provided by a memory controller even before DQs of the memory device have been configured. Further, the fuse-encoded enumeration values may be used with sideband and/or out-of-band operations (e.g., when the DQs are otherwise in use). In embodiments where the existing fuse array and PPR circuitry are utilized, use of fuse-encoded enumeration values may have minimal layout impacts on the memory devices.

Memory banks may generally include a number of additional rows of memory, which may generally be referred to as redundant rows. During a PPR operation, a row address associated with a defective row may be redirected so that it is associated with one of the redundant rows instead. The repair operation may be a hard (or permanent) repair operation, where updated row address information is stored in the memory in a non-volatile form (e.g., stored in a manner that is maintained even when the memory device is powered down). For example, the memory device may include a fuse array, which may include fuses (and/or anti-fuses) which may have state that can be permanently changed (e.g., when the fuse/anti-fuse is "blown"). For the sake of brevity, the term 'fuse' as used herein may be understood to include any non-volatile storage element, such as a fuse, anti-fuse, etc. The state of the fuses in the fuse array may, in part, determine which addresses are associated with which rows of memory.

In some applications, a PPR mode is initiated by a register enable (e.g., a memory controller writing a value to a mode register to enable the PPR mode) of a memory device, and an activation command may be used to transmit the bank and row address of the row to be replaced. A repair command is then issued to select the individual device to be repaired and provide the repair address to the memory device. Responsive to the activation command and repair command in the memory device performs a PPR operation. As part of the PPR operation, circuitry within the memory device may draw sufficient voltages and/or currents to set fuses to appropriate states to remap the row address from the original row to a redundant row. After the PPR operation, the memory controller may issue a precharge command followed by another register write enable to exit the PPR mode.

According to embodiments of the present disclosure, the fuse array may include fuses that are used to program an enumeration value of the memory device rather than remapping addresses to redundant rows. In some embodiments, additional fuses (e.g., two, three, four, eight, etc.) may be added to the fuse array. In other embodiments, existing fuses are set aside for programming the enumeration value.

FIG. 1 is a block diagram of at least a portion of a computing system according to some embodiments of the present disclosure. The computing system 100 includes a memory module 102 and a controller 106 in communication with the memory module 102. In some embodiments, the memory module 102 may be a memory system or included in a memory system. In some embodiments, the controller 106 may be included in a processor (not shown) or in communication with the processor. The memory module 102 may include one or more memory devices 104. In the example shown in FIG. 1, there are eight memory devices 104(0-7). However, in other embodiments, there may be more or fewer memory devices. In some embodiments, additional memory devices 104 may be included to provide for redundancy. In some embodiments, memory module 102 may be a dual in-line memory module (DIMM). In some embodiments, what is shown in FIG. 1 may represent only half of the DIMM (e.g., one of the two channels).

The controller 106 may provide commands, addresses, and/or to one or more of the memory devices 104 and receive data from one or more of the memory devices 104. The various signals transmitted between the controller 106 and memory devices 104 may be transmitted via various conductive traces (e.g., busses) to external terminals (not shown in FIG. 1) of the memory devices 104. For example, the controller 106 may provide data a data bus to the DQ terminals of the memory devices 104. Commands and/or addresses may be provided via a command/address bus to C/A terminals of the memory devices 104. Other commands, addresses, and/or data may be provided via sideband busses and/or out of band buses which may be coupled to external terminals of the memory devices 104. The busses are collectively shown as lines 108 in FIG. 1.

Some commands provided by the controller 106 are executed by all of the memory devices 104 and/or all of the memory devices 104 included in a same rank. For example, the controller 106 may provide a read command and an address to all of the memory devices 104, and all of the memory devices 104 may retrieve data from the address and provide the data at that address to the controller 106. However, other commands provided by the controller 106 may be executed by only specific memory devices 104. The specific memory devices 104 may be indicated by the controller 106 by including an enumeration value assigned to a memory device 104 along with the command, address, and/or data. In the example shown in FIG. 1, the enumeration values are indicated by single digit numbers 110. However, multi-digit numbers or other techniques for encoding the enumeration values may be used.

Examples of commands that may be executed by only a certain memory device 104 include, but are not limited to, mode register write commands, multipurpose commands, VREFCA and VREFCS commands. These commands may be used to configure settings of the memory devices 104 that may vary between memory devices 104. For example, IO driving settings, ODT values, and/or voltage reference values may differ between memory devices 104. The differences may be due to variations in manufacture of the memory devices 104 and/or configuration of the memory module 102 (e.g., coupling to the module, location within the module).

In some embodiments, the controller 106 may issue a command to the memory devices 104 to enter an enumeration mode (e.g., by writing a value to the mode registers). Once the memory devices 104 have entered the enumeration mode, the controller 106 may issue one or more commands along with a respective enumeration value of a target memory device 104. Once the target memory device(s) 104 have executed the command(s), the memory controller 106 may exit the enumeration mode (e.g., by writing another value to the mode registers). However, in other embodiments, certain commands may be associated with an enumeration value (e.g., enumerated commands), and the memory devices 104 may be configured to ignore (e.g., not execute) a received enumerated command that is accompanied by an enumeration value not assigned to the memory device 104. In some embodiments, the enumerated commands may optionally be accompanied by an enumeration value that indicates all memory devices 104 are selected. For example, a mode register write command may be an enumerated command, but an enumeration value indicating all memory devices 104 may be provided. This may facilitate programming mode register values that are common to all of the memory devices 104.

Prior to providing enumerated commands, the memory devices 104 are assigned the enumerated values 110. According to embodiments of the present disclosure, upon being packaged on the memory module 102, or just prior to being packaged on the memory module 102, the memory devices 104 may be programmed with unique enumeration values. A controller 106 and/or a different controller, may be used to program the enumeration value.

In some embodiments, the controller 106 may enter an enumeration value programming mode (e.g., by writing a value to a mode register of the memory device(s) 104). In some embodiments, an individual memory device 104 of the memory devices 104 may be selected for enumeration programming through DQ bits. An enumeration value programming command and an enumeration value to be programmed may be provided from the controller 106 to the selected memory device 104. While all of the memory devices 104 may receive the command and enumeration value, the unselected memory devices 104 may be configured to ignore the command based on the state of the unselected memory devices 104 DQ bits.

Responsive to the enumeration programming command and the enumeration value, the selected memory device 104 may utilize PPR circuitry (not shown in FIG. 1) included with the memory device 104 to program one or more fuses of a fuse array (also not shown in FIG. 1) with the received enumeration value. The memory device 104 may use the programmed enumeration value in the fuse array to determine when an enumerated command should be executed or ignored by the memory device 104. The enumeration value may remain programmed in the memory device 104 even if the memory device 104 loses power or is reset. That is, in some embodiments, the enumeration value may be permanently programmed in the memory device 104.

The controller 106 may deselect the memory device 104 by changing the state of the DQ pins. The controller 106 may select another memory device 104 and repeat the enumeration programming until all of the memory devices 104 have been enumerated (e.g., programmed with enumeration values). Once all of the desired memory devices 104 have been enumerated, the controller 106 may exit the enumeration programming mode (e.g., by writing another value to the mode registers).

While DQ bits are used in the example described to select a memory device 104 prior to programming enumeration values, in other embodiments, other techniques may be used. However, even when DQ bits are used to program the enumeration values, once enumeration values are programmed, access to the DQ bits may no longer be required to select a specific memory device 104.

Figure 2:
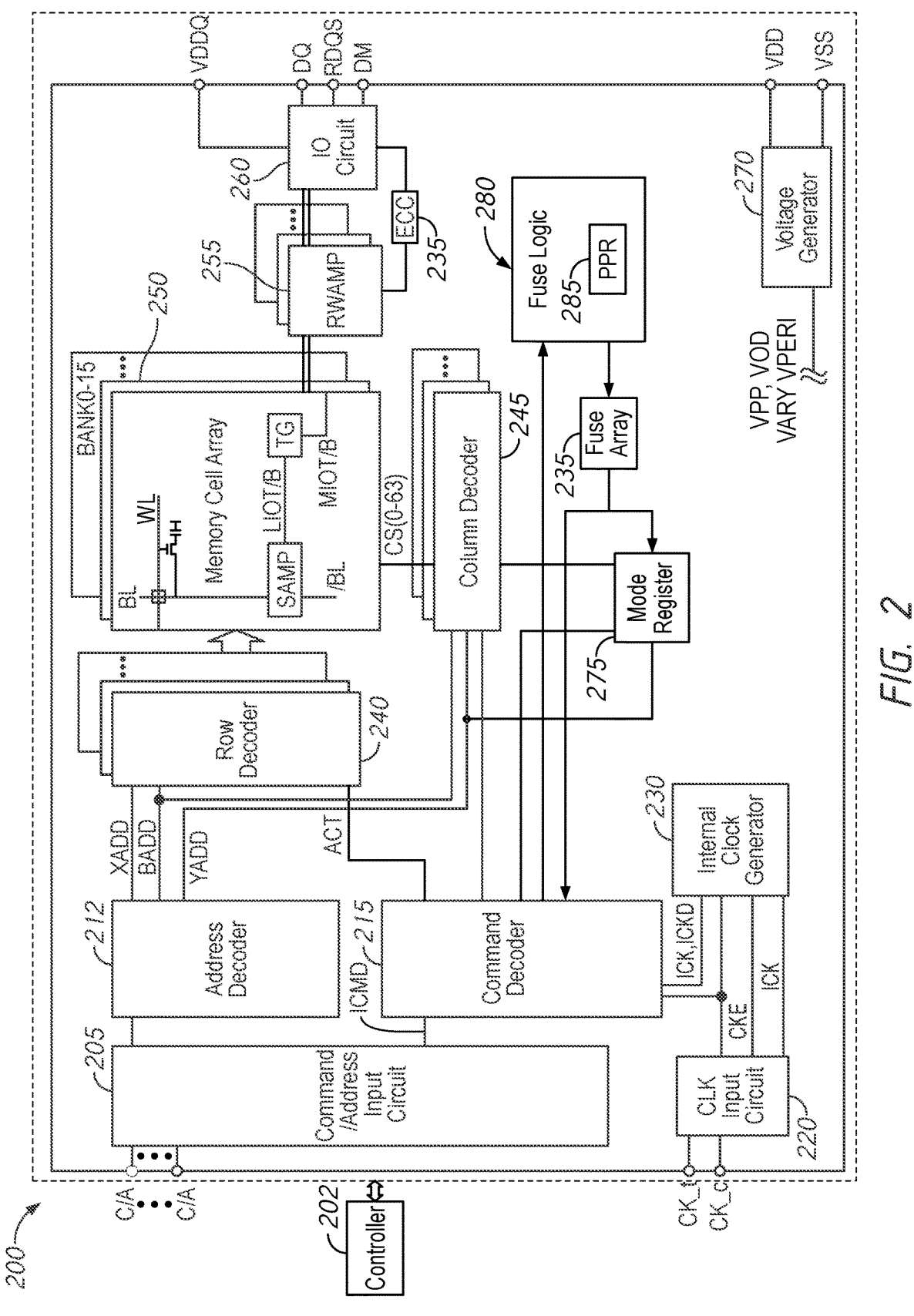
FIG. 2 is a block diagram of a semiconductor device according to some embodiments of the present disclosure.

FIG. 2 is a block diagram of a semiconductor device according to some embodiments of the present disclosure. The apparatus may be a semiconductor device 200, and will be referred as such. In some embodiments, the semiconductor device 200 may include, without limitation, a dynamic random access (DRAM) device integrated into a single semiconductor chip. In some examples, the DRAM may be a double data rate (DDR) memory. In some embodiments, one or all of the memory devices 104(0-7) may include semiconductor device 200.

The semiconductor device 200 includes a memory die. The die may be mounted on an external substrate, for example, a memory module substrate, a mother board or the like (e.g., package-on-package (POP)). The semiconductor device 200 may further include a memory array 250. The memory array 250 includes a plurality of banks BANK0-15, each bank including a plurality of word lines WL, a plurality of bit lines BL, and a plurality of memory cells MC arranged at intersections of the plurality of word lines WL and the plurality of bit lines BL. Although sixteen banks are shown in FIG. 2, memory array 250 may include any number of banks. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches. The TG may be coupled to one or more read/write amplifiers (RWAMP) 255, which may be coupled to an error correction code (ECC) circuit 235. The ECC circuit 235 may be coupled to an IO circuit 260, which may be coupled to one or more external terminals of semiconductor device 200. Read data from the bit line BL is amplified by the sense amplifier SAMP, and transferred to read/write amplifiers 255 over complementary local data lines (LIOT/B), transfer gate (TG), and complementary main data lines (MIOT/B) to the ECC circuit 235. Conversely, write data outputted from the ECC circuit 235 is transferred to the sense amplifier SAMP over the complementary main data lines MIOT/B, the transfer gate TG, and the complementary local data lines LIOT/B, and written in the memory cell MC coupled to the bit line BL.

The semiconductor device 200 may employ a plurality of external terminals that include command and address terminals coupled to a command/address (C/A) bus to receive command and address signals, clock terminals to receive clock signals CK_t and CK_c, data terminals DQ, RDQS, and power supply terminals VDD, VSS, VDDQ, and VSSQ.

The C/A terminals may be supplied with an address and a bank address signal from outside, for example, from a controller 202. The address signal and the bank address signal supplied to the address terminals are transferred, via a command/address input circuit 205, to an address decoder 212. The address decoder 212 receives the address signals and supplies a decoded row address signal XADD to the row decoder 240, and a decoded column address signal YADD to the column decoder 245. The address decoder 212 also receives the bank address signal BADD and supplies the bank address signal to the row decoder 240 and the column decoder 245.

The C/A terminals may further be supplied with command signals from, for example, a controller 202. In some embodiments, controller 202 may be implemented or included in controller 106. The command signals may be provided as internal command signals ICMD to a command decoder 215 via the command/address input circuit 205. The command decoder 215 includes circuits to decode the internal command signals ICMD to generate various internal signals and commands for performing operations, for example, a row activation signal (ACT) to select a word line and a column select signal (CS) (or referred to simply as column selects) to select one or more bit lines. Another example may be providing internal signals to enable circuits for performing operations, such as control signals to enable signal input buffers that receive clock signals. The internal commands also include output and input activation commands.

The C/A terminals may receive an access command which is a read command. When a read command is received, and a bank address, a row address and a column address are timely supplied with the read command, a codeword including read data and read ECC data (e.g., parity bits) is read from memory cells in the memory array 250 corresponding to the row address and column address. The read command is received by the command decoder 215, which provides internal commands so that read data from the memory array 250 is provided to the ECC circuit 235. The ECC circuit 235 may use the parity bits in the codeword to determine if the codeword includes any errors, and if any errors are detected, may correct them to generate a corrected codeword (e.g., by changing a state of the identified bit(s) which are in error). The corrected codeword (without the parity bits) is output from the data terminals DQ via the input/output circuit 260.

The C/A terminals may receive an access command which is a write command. When the write command is received, and a bank address, a row address, and a column address are timely supplied as part of the write operation, and write data is supplied through the DQ terminals to the ECC circuit 235. The write supplied to the data terminals DQ is written to a memory cells in the memory array 250 corresponding to the row address and column address. The write command is received by the command decoder 215, which provides internal commands so that the write data is received by data receivers in the input/output circuit 260. The write data is supplied via the input/output circuit 260 to the ECC circuit 235. The ECC circuit 235 may generate ECC data (e.g., a number of parity bits) based on the write data, and the write data and the parity bits may be provided as a codeword to the memory array 250 to be written into the memory cells MC.

The command decoder 215 may access mode register 275 that is programmed with information for setting various modes and features of operation for the semiconductor device 200. For example, the mode register 275 may provide parameters that allow the semiconductor device 200 to operate at different frequencies, provide different burst lengths, allow banks BANK0-15 to be organized into different groups, operate in x4, x8, or x16 mode, and/or other different operating conditions (e.g., enumerated command mode, PPR mode, enumeration value programming mode). In some embodiments, mode register 275 may include multiple registers.

The information in the mode register 275 may be programmed by providing the semiconductor device 200 a mode register write command (e.g., from controller 202), which causes the semiconductor device 200 to perform a mode register write operation. In some embodiments, data to be written to the mode register 275 is provided via the C/A terminals and/or the DQ terminals. The command decoder 215 accesses the mode register 275, and based on the programmed information along with the internal command signals provides the internal signals to control the circuits of the semiconductor device 200 accordingly. Information programmed in the mode register 275 may be externally provided by the semiconductor device 200 using a mode register read command, which causes the semiconductor device 200 to access the mode register 275 and provide the programmed information (e.g., to the memory controller 202). In some embodiments, the information may be provided via the C/A terminals and/or the DQ terminals.

The device 200 also includes a fuse array 235, which contains multiple non-volatile storage elements (e.g., fuses) which may store information about addresses in the memory array 250 and an enumeration value of the device 200. Each fuse may start in a first state (e.g., an anti-fuse may be insulating), and may be 'blown' to permanently change the fuse's state (e.g., a blown anti-fuse may be conductive). Each fuse may be considered to be a bit, which is in one state before it is blown, and permanently in a second state after it's blown. For example, a fuse may represent a logical low before it is blown and a logical high after it is blown.

Specific groups of fuses may be represented by a fuse bank address FBA, which may specify the physical location of each of the fuses in the group within the fuse array 235. The group of fuses associated with a particular FBA may act as a row repair element (RRE). The RRE may be encoded with a row address to be repaired (e.g., by blowing fusing to encode a binary string of the row address). The RRE may be associated with a particular redundant row of the memory array 250. The address information in the fuse array 235 may be 'scanned' out along a fuse bus (FB and xFB) to row latches of the array 250. Each row latch may be associated with a particular word line of the memory array 250. In some embodiments, only the redundant rows of the memory array 250 (e.g., the rows designated for use in repair operations) may be associated with one of the row latches. The address stored in a given RRE may be scanned out from the fuse array 235 along the fuse bus, and may be latched by a particular row latch. In this manner, an address stored in an RRE the fuse array 235 may be associated with a particular row of the memory array 250. The address stored in the row latch may then direct access commands to the word lines associated with the row latch. Accordingly, programming a row address into an RRE of the fuse array 235 may repair that row address by reassigning it to a redundant word line.

In some embodiments, a specific group of fuses associated with a FBA may be associated with an enumeration value of the device 200 rather than a word line. In some embodiments, this group of fuses may be accessed by the command decoder 215 and/or mode register 275 rather than being associated with row latches. In some embodiments, the specific group of fuses associated with the enumeration value may include one or more fuses. In some embodiments, the group may include eight fuses. In these embodiments, the enumeration value may be up to eight bits.

A fuse logic circuit 280 may be positioned along the fuse bus. The fuse logic circuit 280 may include post package repair (PPR) circuits 285 (e.g., hard PPR circuits) which may be used to make changes to the fuse array 235 after the memory device 200 is packaged (e.g., packaged into a chip). For example, the PPR circuits 285 may perform a hard repair, where fuses in an RRE the fuse array 235 (e.g., the fuses at the FBA associated with the enumeration value) are blown to 'repair' a row by encoding the repaired row address permanently into the RRE in the fuse array 235.

According to embodiments of the present disclosure, when an enumeration programming command is received along with an enumeration value, the PPR circuits 280 may selectively blow fuses of the fuse array 235 to permanently encode the enumeration value into the device 200.

In some embodiments, the command decoder 215 may access the fuses encoding the enumeration value to determine whether to execute or ignore an enumerated command. For example, the command decoder 215 may compare the enumerated value received with the command to the enumerated value in the fuse group. If the received enumeration value matches the enumerated value in the fuse group, the command decoder 215 may cause the enumerated command to be performed. If the enumerated values do not match, the command decoder 215 may not cause the command to be executed (e.g., ignore the command). In some embodiments, a value that does not match the enumerated value may be received, but that value may indicate that all memory devices, including device 200, are selected. In these embodiments, the command decoder 215 may cause the command to be executed.

In some embodiments, the controller 202 may issue a command to read the fuse array 235 to determine the enumeration value of the device 200. In some embodiments, the enumeration value of the device 200 may be provided from the fuse array 235 to the mode register 275, and the controller 202 may access the enumeration value via a mode register read command.

Turning to the explanation of the external terminals included in the semiconductor device 200, the clock terminals and data clock terminals are supplied with external clock signals and complementary external clock signals. The external clock signals CK_t, CK_c may be supplied to a clock input circuit 220. When enabled, input buffers included in the clock input circuit 220 pass the external clock signals. For example, an input buffer passes the CK_t and CK_c signals when enabled by a CKE signal from the command decoder 215. The clock input circuit 220 may use the external clock signals passed by the enabled input buffers to generate internal clock signal ICK. The internal clock signal ICK are supplied to internal clock circuit 230 for providing one or more clock signals to the various components of semiconductor device 200.

The internal clock circuits 230 includes circuits that provide various phase and frequency controlled internal clock signals based on the received internal clock signals. For example, the internal clock circuits 230 may include a clock path (not shown in FIG. 2) that receives the ICK clock signal and provides internal clock signals ICK and ICKD to the command decoder 215. Optionally, the input/output circuit 260 may include clock circuits and driver circuits for generating and providing the RDQS signal to a controller.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and the like and a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks.

The power supply terminal is also supplied with power supply potential VDDQ. The power supply potentials VDDQ is supplied to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

FIG. 3 is a flow chart of a method according to embodiments of the present disclosure. In some embodiments, the method 300 may be performed in whole or in part by a controller, such as controller 106 and/or controller 202.

At block 302 "providing a mode register write command to a memory device" may be performed. In some embodiments, the mode register write command may cause a value to be written to the mode register to enable an enumeration value programming mode. In some embodiments, the value may also be provided.

At block 304, "providing an enumeration value programming command" may be performed. In some embodiments, the DQ bits of the memory device may be set to a desired value to select the memory device prior to or when the enumeration value programming command is provided.

At block 306 "providing an enumeration value to be programmed to the memory device" may be performed.

Optionally, at block 308, "providing a second mode register write command to the memory device" may be performed. The command may cause a second value to be written to the mode register to disable the enumeration value programming mode. In some embodiments, the second value may also be provided to the memory device.

Optionally, in some embodiments, method 300 may further include "providing a mode register read command to read the enumeration value programmed to the memory device" as indicated by block 310.

After blocks 302-306 and optionally block 308 are completed, method 300 may optionally include block 312 where "providing an enumerated command" is performed and block 314 where "providing a second enumeration value" is performed. In some embodiments, the second enumeration value and the enumeration value are the same. Optionally, providing a second mode register write command to the memory device to cause a value to be written to the mode register to enable an enumerated command mode prior to providing the enumerated command and providing a third mode register write command to the memory device to cause a second value to be written to the mode register to disable the enumerated command mode after providing the enumerated command and the second enumeration value may be performed.

Optionally blocks 302-306, blocks 302-308, and/or blocks 304 and 306 may be repeated for a plurality of memory devices.

FIG. 4 is a flow chart of a method according to embodiments of the present disclosure. In some embodiments, method 400 may be performed in whole or in part by a memory device, such as any or all of memory devices 104 and/or device 200.

At block 402, "receiving a mode register write command at a memory device from a controller" may be performed. The command may be received at C/A terminals of the memory device in some embodiments.

At block 404, "writing a value to the mode register responsive to the command" may be performed. In some embodiments, the value written may have been received from the controller.

At block 406, "enabling an enumeration value programming mode" may be performed.

At block 408, "receiving an enumeration value programming command" may be performed.

At block 410, "receiving an enumeration value" may be performed.

At block 412, "writing the enumeration value to a fuse array responsive to the enumeration value programming command" may be performed. In some embodiments, the enumeration value may be written to the fuse array with PPR circuitry of the memory device.

Optionally, method 400 may further include block 414 where "receiving a second mode register write command to the memory device" is performed, block 416 where "writing a second value to the mode register responsive to the second mode register command" is performed, and block 418 where "disabling the enumeration value programming mode" is performed.

After the blocks shown in FIG. 4 have been completed, method 400 may optionally further include receiving an enumerated command, receiving a second enumeration value, and comparing the second enumeration value to the enumeration value. In some embodiments, executing the enumerated command may occur when the enumeration value and the second enumeration value are the same and ignoring the enumerated command may occur when the enumeration value and the second enumeration values are different. In some embodiments, executing the enumerated command may occur when the second enumeration value is associated with a value indicating that all memory devices of a rank including the memory device are selected. Optionally, method 400 may include receiving a second mode register write command to the memory device, writing a third value to the mode register, and enabling an enumerated command mode prior to the comparing. Optionally method 400 may further include receiving a third mode register write command after receiving the enumerated command and the second enumeration value, writing a fourth value to the mode register, and disabling the enumerated command mode.

The apparatuses, systems, and methods disclosed herein may allow an enumeration value of a memory device to be programmed into non-volatile storage elements (e.g., fuses) of the memory device. In some applications, using fuses may obviate the need to program the enumeration values for the memory device for each reset and power-up. In some applications, using fuses to program the enumeration value may allow memory device-specific commands to be provided by a memory controller even before DQs of the memory device have been configured. Further, the fuse-encoded enumeration values may be used with sideband and/or out-of-band operations (e.g., when the DQs are otherwise in use). In embodiments where the existing fuse array and PPR circuitry are utilized, use of fuse-encoded enumeration values may have minimal layout impacts on the memory devices.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A memory device comprising:
   a fuse array comprising a plurality of fuses configured to store an enumeration value of the memory device;
   a post-package repair (PPR) circuit configured to program the plurality of fuses with the enumeration value;
   a mode register configured to store values associated with enabling and disabling a plurality of operation modes of the memory device, wherein the plurality of operation modes includes an enumerated command mode and an enumeration value programming mode.

2. The memory device of claim 1, wherein the fuse array further comprises a second plurality of fuses configured to store at least one row address to be repaired.

3. The memory device of claim 2, wherein the PPR circuit is configured to program the second plurality of fuses.

4. A memory device comprising:
   a fuse array comprising a plurality of fuses configured to store an enumeration value of the memory device;
   a post-package repair (PPR) circuit configured to program the plurality of fuses with the enumeration value; and
   a command decoder configured to receive commands and enumeration values and compare the enumeration values to the enumeration value stored in the fuse array.

5. The memory device of claim 4, wherein the command decoder is further configured to cause a command of the commands to be executed by the memory device when an enumeration value of the enumeration values matches the enumeration value stored in the fuse array.

6. A method comprising:
   providing a mode register write command to a memory device to cause a value to be written to the mode register to enable an enumeration value programming mode;
   providing an enumeration value programming command; and
   providing an enumeration value to be programmed to the memory device.

7. The method of claim 6, further comprising providing a second mode register write command to the memory device to cause a second value to be written to the mode register to disable the enumeration value programming mode.

8. The method of claim 6, further comprising issuing a mode register read command to read the enumeration value programmed to the memory device.

9. The method of claim 6, further comprising:
   providing an enumerated command; and
   providing a second enumeration value.

10. The method of claim 9, wherein the second enumeration value and the enumeration value are the same.

11. The method of claim 9, further comprising:
   providing a second mode register write command to the memory device to cause a value to be written to the mode register to enable an enumerated command mode prior to providing the enumerated command; and
   providing a third mode register write command to the memory device to cause a second value to be written to the mode register to disable the enumerated command mode after providing the enumerated command and the second enumeration value.

12. The method of claim 6, further comprising repeating steps of claim 7 for a plurality of memory devices.

13. A method comprising:
   receiving a mode register write command at a memory device from a controller;
   writing a value to the mode register responsive to the command;
   enabling an enumeration value programming mode;
   receiving an enumeration value programming command;
   receiving an enumeration value; and
   writing the enumeration value to a fuse array responsive to the enumeration value programming command.

14. The method of claim 13, further comprising:
   receiving a second mode register write command to the memory device;
   writing a second value to the mode register responsive to the second mode register command; and
   disabling the enumeration value programming mode.

15. The method of claim 13, further comprising:
   receiving an enumerated command;
   receiving a second enumeration value; and
   comparing the second enumeration value to the enumeration value.

16. The method of claim 15, further comprising:
   executing the enumerated command when the enumeration value and the second enumeration value are the same; and
   ignoring the enumerated command when the enumeration value and the second enumeration values are different.

17. The method of claim 15, further comprising executing the enumerated command when the second enumeration value is associated with a value indicating that all memory devices of a rank including the memory device are selected.

18. The method of claim 15, further comprising:
   receiving a second mode register write command to the memory device;

US 12,640,217 B2

13 writing a third value to the mode register; and
enabling an enumerated command mode prior to the comparing.
19. The method of claim 18, further comprising:
receiving a third mode register write command after receiving the enumerated command and the second enumeration value;
writing a fourth value to the mode register; and
disabling the enumerated command mode.

\* \* \* \* \*

14